United States Patent [19]
Lin

[11] Patent Number: 5,973,921
[45] Date of Patent: Oct. 26, 1999

[54] FIXATION STRUCTURE FOR THE FAN OF THE CPU HEAT DISSIPATING DEVICE

[76] Inventor: Yu-Chen Lin, No.31, Sec. 1 , Ming Yi Road.,Wu Ku Hsiang, Taipei Hsian, Taiwan

[21] Appl. No.: 08/963,558

[22] Filed: Nov. 3, 1997

[51] Int. Cl.[6] ....................................................... H05K 7/20
[52] U.S. Cl. .......................... 361/695; 361/697; 361/704; 165/80.3; 165/122; 165/185; 174/16.1; 174/16.3; 257/706; 257/718; 257/719; 257/721; 257/722; 257/727
[58] Field of Search ..................................... 361/695, 697, 361/704, 707, 709–710; 165/89.2, 80.3, 185; 174/16.3; 257/706, 707, 718, 719, 727

[56] References Cited

U.S. PATENT DOCUMENTS

| | | | |
|---|---|---|---|
| 5,335,722 | 8/1994 | Wu | 361/697 |
| 5,835,347 | 11/1998 | Chu | 361/697 |
| 5,841,633 | 11/1998 | Huang | 361/695 |
| 5,854,738 | 12/1998 | Bowler | 361/695 |
| 5,864,464 | 1/1999 | Lin | 361/697 |
| 5,870,288 | 2/1999 | Chen | 361/704 |

*Primary Examiner*—Leo P. Picard
*Assistant Examiner*—Boris L. Chervinsky

[57] ABSTRACT

A fixation structure for the fan to be coupled with the heat dissipating device for the central processing unit (CPU), in particular applies to the CPU which is perpendicularly inserted into the housing wherein the fan is mounted to a base set and uniformly formed as a single unit in which that a pair of the fixation plates extendingly from the base set are positioned respectively opposite to each other where the end of the fixation plate bends outward to form a flanged clipping body. The above mentioned base set is constructed in accordance with the heat dissipating device for the CPU, where two clipping holes positioned respectively to the clip structure is formed on the heat dissipating device so as to allow the clipping body be inserted therein and engaged thereto forming a single unit, which provide a sufficient and quick method of assemblement.

1 Claim, 3 Drawing Sheets

FIXATION STRUCTURE FOR THE FAN OF THE CPU HEAT DISSIPATING DEVICE

FILED OF THE INVENTION

The present invention relates generally to a fixation structure of a fan for a CPU heat dissipating device, and in particular to a clip structure which provides a sufficient and quick assembly between the fan and the heat dissipating device.

BACKGROUND OF THE INVENTION

With the development in the computer and the electronic technologies, efficiency of the central processing unit (CPU) has been improved dramatically from 80386 and 80486 in early ages to PENTIUM® and then to the fashion of the PC industry nowadays—the PENTUIUM® PRO. Caches as we know are built into the CPUs in order to reduce timing required for processing within the computer. Nevertheless, without modifies on the fins and surface area of the CPU, a increase of temperature and the rate of insufficiency process within CPU has been found. As the a result therefrom, in order to improve this situation, INTEL has re-constructed the structure of CPU and came up with a newly designed item, i.e. the P6 CPU with a complete different structure and named it as PENTIUM II®.

PENTIUM II® is constructed in such a way that a CPU and an external cache is mounted to the printed circuit board (PCB) which then covered up by the PLGA (plastic land-grid array) and by the connecting plate extending from the PCB called the god fingers, it is then connected to the main board. From here, in order to face up with such an evolution in the computer industry, manufactures of the main frames have reconstructed their frame boards accordingly and developed the newly designed main frame which replaces the ZIF fins of the original design to the insertion grooves now so that method of inserting the CUP to a computer has become perpendicularly instead of horizontally. It is a common knowledge for us to know that the faster the processing speed for a CPU, the amount of heat produced therefrom will respectively be increased. To stabilize the operation of a CPU, the use of a heat dissipating device is an un-eliminatable factor. To avoid the possibilities that the rate of distributing heat by the heat dissipating device is lower than the rate of heat production by the CPU, adding on a fan to the heat dissipating device is the most convenient and the most economic way to overcoming this problem. However, the configuration of PENTIUM II® has a much bigger size in comparison with the conventional CPU, and accordingly, the size of a heat dissipating device has been increased where the conventional ZIF base set clipper configured heat dissipating device with the fan can no longer be applied to the PENTIUM II®. To follow up with the modification of the CPU, method and construction of clipping a fan to the heat dissipating device is now required a respective modification.

As illustrated in FIGS. 1 and 2, in order to allow the users to affix the heat dissipating device on the PENTIUM II®, the PLGA packaging of the CPU 10 is formed with a plurality of clipping holes 11 constructed parallel to each other on the two sides of the CPU 10 respectively. The heat dissipating device 20 is provided with a nonfined region 21 in accordance with the clipping holes 11 of the CPU 10. A clipping affixation structure 30 is formed by coupling two spring elements 31 together, extending from the two ends of the spring element 31 positioned respectively to the clipping holes 11 are the flange clip bodies 32 with one of its end forming the trigger 33. To proceeds such an assembly, a flanged clipping bodies 32 is inserted to the clipping hole 11 of the PLGA packaging of the CPU 10. Meanwhile two spring elements 31 are placed in accordance with the non-fins region 21 of the heat dissipating device 20 and pushes down the trigger 33 so as to allow the other two clip body 32 relatively inserted to the other two clip holes 11 of the PLGA packaging of the CPU 10 so that the heat dissipating device 20 is now firmly affixed to the CPU 10. However, within this type of assembly, fan 40 can only be secured with the heat dissipating device 20 by the screw pin, which cause inconveniences and cumbersome in the process of departing the two units while the fan 40 is an essential device to the CPU 10.

SUMMARY OF THE INVENTION

It is therefore a principle object of the present invention to provide a fixation structure for coupling a fan to a heat dissipating device for computer CPUs.

To achieve the above object, the fan is mounted to a base set unitary forming a single unit with the two sides of the base set having a pair of fixation plates respectively extending therefrom, in which the end of the fixation plate is bent outward to form a flanged clipping body. The above mentioned base set is so in accordance with the assembly of the heat dissipating device, so that on the heat dissipating device positioned respectively to the fixation plate are the through holes for the clipping body to be inserted therein so that the fan and the heat dissipating device are affixed together and provide with a sufficient and quick method of assembly.

BRIEF DESCRIPTION OF THE DRAWINGS

The structure and features of the present invention will be better understood from the following description of a preferred embodiment of the present invention, with reference to the attached drawings, wherein.

DETAILED DESCRIPTION OF THE PREFERRED EMBODIMENT

Figure 1:
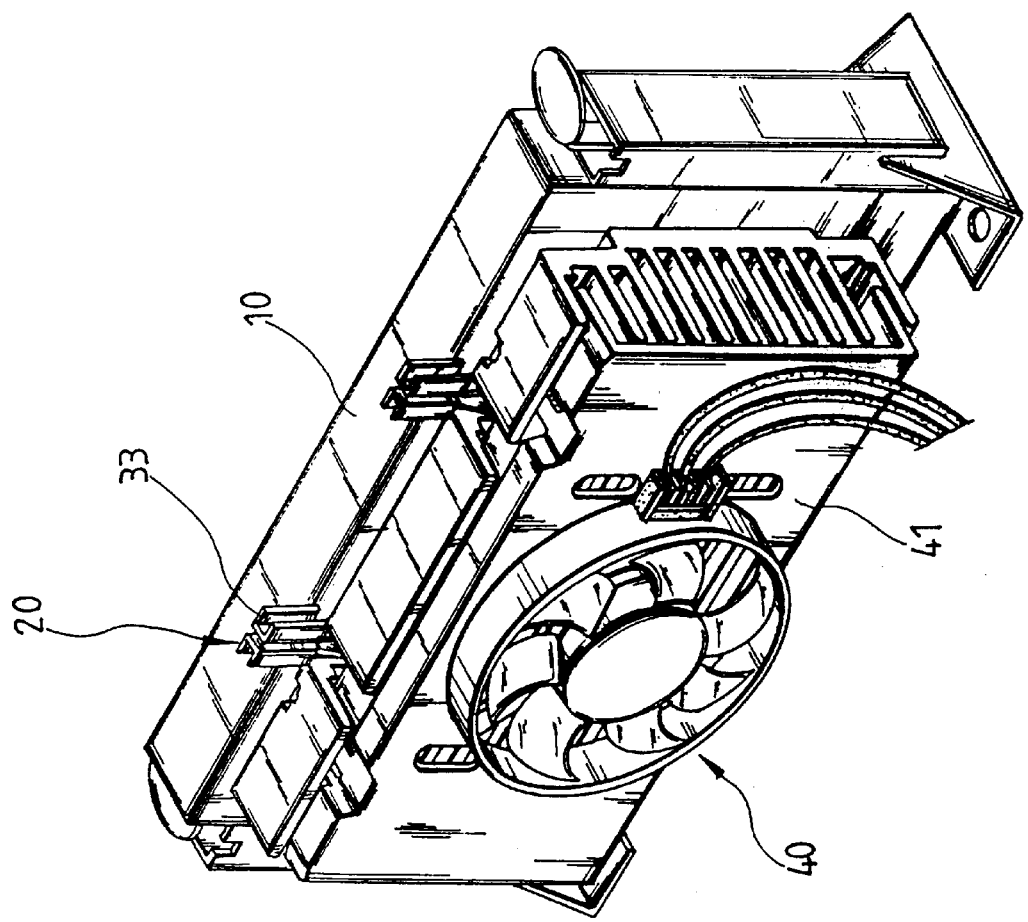
FIG. 1 is a perspective view showing a fixation structure for coupling a fan to a CPU heat dissipating device constructed in accordance with the present invention.
Figure 2:
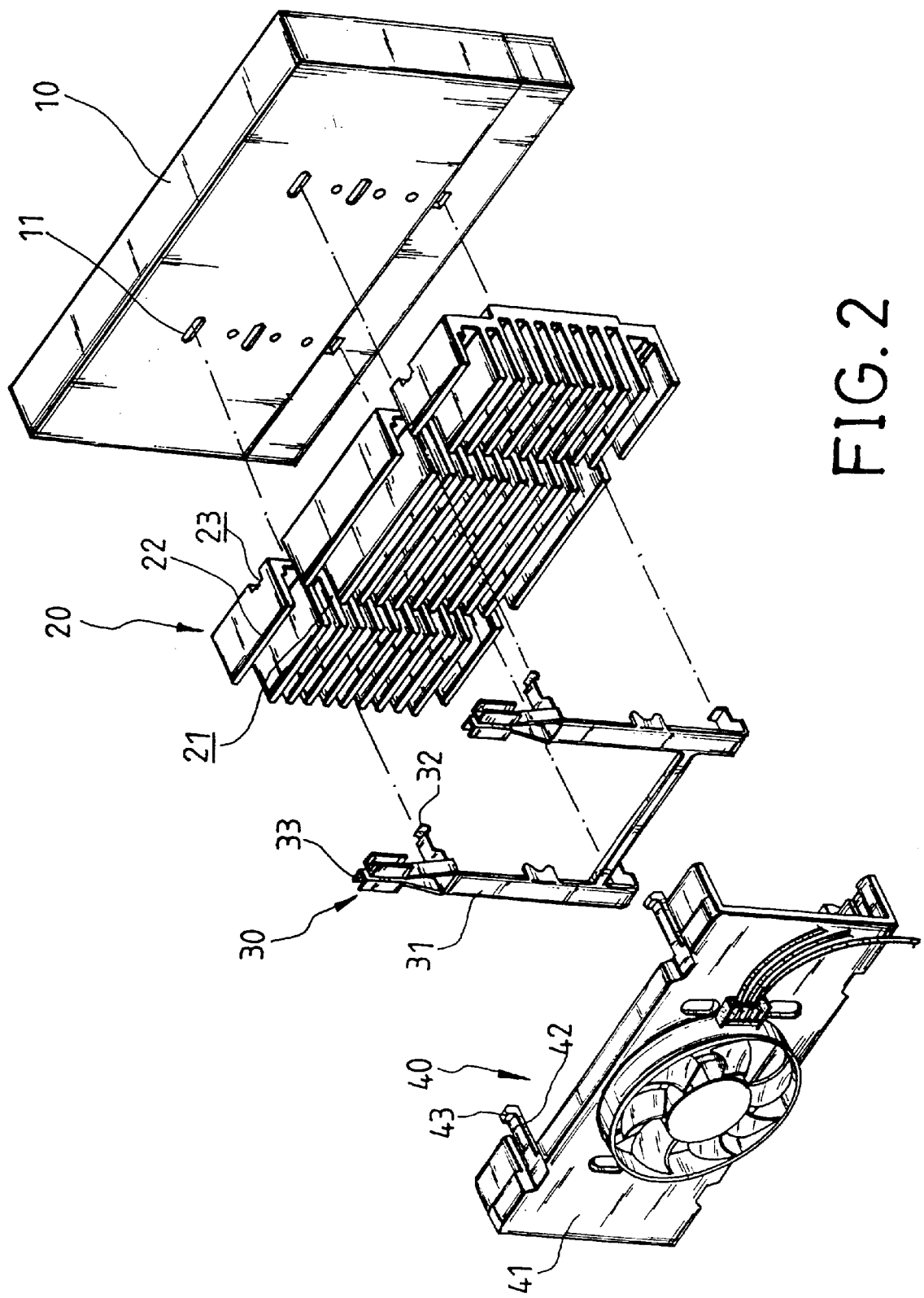
FIG. 2 is an exploded perspective view of the fixation structure.

With reference to the drawings and in particular to FIGS. 1 and 2, wherein a fixation structure coupling a fan to a CPU dissipating device constructed in accordance with the present invention is shown, the heat distribution fan 40 is mounted to a base set 41 and unitarily formed therewith as a single unit. Two sides of the base set 41 have a pair of fixation plates 42 extending therefrom, where the end of the fixation plate 42 bends outward to form a flanged clipping bodies 43.

The construction of the dissipating device 20 and the fixation structure 30 as mentioned before are already known to those skilled in the art and shall not be described in further details herein. Nevertheless, the bottom of the heat dissipating device 20 is provided with through holes 23 positioned next to the outermost of the heat dissipating fins 22 and corresponding to the fixation plates 42 so as to allow the flanged clipping bodies 43 of the fixation plates 42 to be inserted and engaged thereto. This fixes the fan 40 to the heat dissipating device 20 in a releasable manner.

Figure 3:
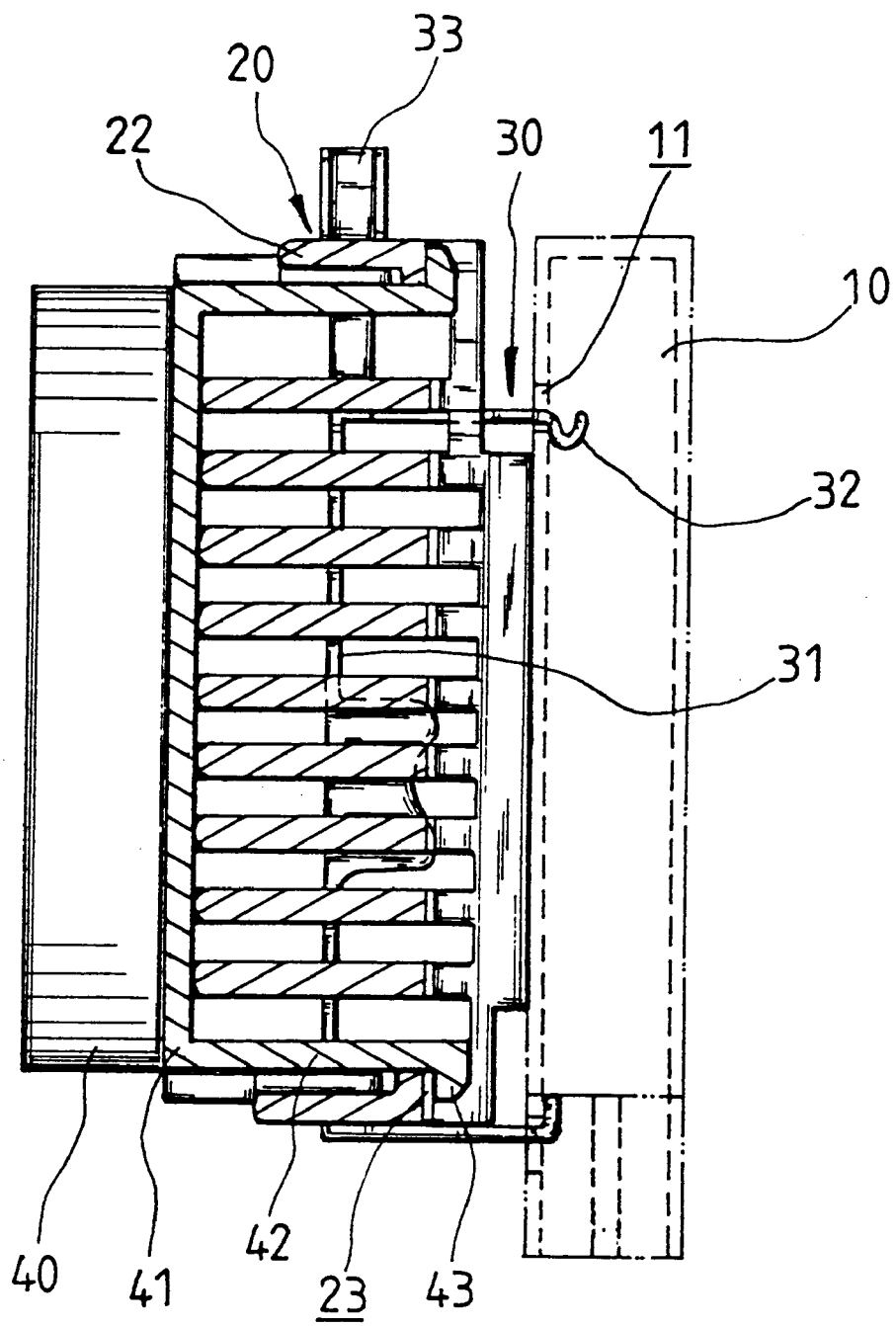
FIG. 3 is an enlarged cross-sectional view showing the fan and the CPU heat dissipating device of the present invention.

As showed in FIG. 3, the heat dissipating device 20 is inserted and engaged with the PLGA packaging of CPU 10 via the flanged clipping bodies 32 of the spring elements 31 of the fixation structure 30 so that the CPU dissipating device 20 is firmly attached to the surface of the CPU 10 packaging. The base set 41 of the fan 40 is then pushed against the heat dissipating device 20 so that the clipping bodies 43 of the fixation plates 42 are inserted into the through holes 23 of the heat dissipating device 20 respectively to have the fan 40 is affixed onto the surface of the heat dissipating device 20 and engaged there to.

The present invention is been carried out in such a way that by the method of clipping, the fan 40 is affixed onto the surface of the heat dissipating device 20 which eliminates the use of the screws as the conventional method and avoids the likelihood of troubles occurring therefrom by screwing the two units together. Although the present invention is based on the PENTIUM II® designed by the manufacture INTEL, the same invention may as well be applied to the CPUs which are to be inserted and engaged to the machines such as Power Macintosh® by APPLE or Motorola 604® etc.

While the structure and features of the present invention have become more apparent from the above detailed description and illustration, it will be understood by the person skilled in the art that various changes and detail may be made without departing from the spirit and scope of the invention. Although only the preferred embodiment of this invention was shown and described in the above description, it is requested that any modification or combination that come within the spirit of this invention be protected.

What is claimed is:

1. A fixation structure for coupling a fan to a CPU heat dissipation device, wherein the CPU heat dissipation device comprises a button on which a plurality of through holes are formed, the fixation structure comprising:

a base set having a top face adapted to support the fan thereon and two opposite sides each having a plurality of clipper bodies formed thereon to be respectively corresponding to and engageable with the trough holes of the CPU heat dissipation device for releasably and readily securing the fan that is supported on the base set to the CPU heat dissipation device a heat dissipating device, constructed in accordance with the base set so that through holes are formed with respect to the clipper body of the base set to allow the clipper body inserted therein to form a firm fixation between the fan that is mounted to the base set and the heat dissipating device and become a single processing unit therefrom.

\* \* \* \* \*